April 14, 1959 J. H. WERNICK 2,882,192

SEMICONDUCTING MATERIALS AND DEVICES MADE THEREFROM

Filed May 10, 1957

INVENTOR
J. H. WERNICK
BY
George S. Indig
ATTORNEY

United States Patent Office
2,882,192
Patented Apr. 14, 1959

2,882,192

SEMICONDUCTING MATERIALS AND DEVICES MADE THEREFROM

Jack H. Wernick, Morristown, N.J., assignor to Bell Telephone Laboratories, Incorporated, New York, N.Y., a corporation of New York Application May 10, 1957, Serial No. 658,436

8 Claims. (Cl. 148—33)

This invention relates to ternary semiconductive compounds and to semiconductive devices containing such compounds.

In accordance with this invention it has been discovered that two compounds of the general composition $Cu_3XS_4$ in which X is arsenic or antimony possess semiconductive properties of interest from a device standpoint. These materials have intrinsic energy gaps of about 0.8 so that these materials are useful in the construction of common semiconductor devices such as rectifiers and transducers and in photo devices such as infrared detectors. The materials of this invention in addition to being intrinsic semiconductors evidence extrinsic semiconductive properties so that they may be used both in point-type and in junction-type devices.

The two compounds of this invention are discussed in terms of their electrical and physical properties and their use in a typical transducing device, a junction-type rectifier. Although both the materials described herein are known to occur in nature, supply and purity considerations have led to their synthesis. For this reason a method by the use of which these compounds have been synthesized is described.

Figure 1:
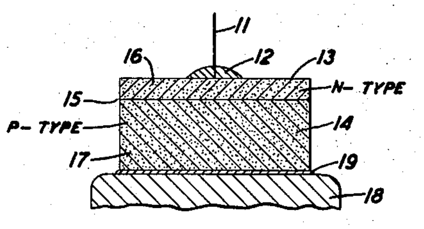
Figure 2:
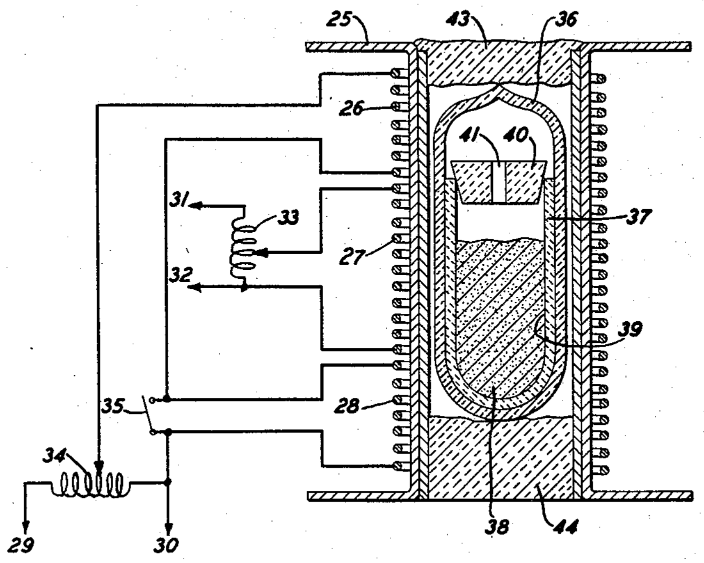

The invention may be more easily understood by reference to the following figures in which:

Fig. 1 is a schematic front elevational view in section of a junction-type diode utilizing one of the compounds herein; and Fig. 2 is a schematic cross-sectional view of apparatus used in the preparation of each of the compounds of this invention.

Referring again to Fig. 1 the device depicted is a junction-type diode consisting of electrode 11 making ohmic connection 12 with surface 13 of block 14 which may, for example, be $Cu_3AsS_4$ and which block contains p-n junction 15 between region 16 which is of one conductivity type and region 17 which is of the opposite conductivity type. Electrode 18 makes ohmic contact to semiconductor block 14 by means, for example, of solder joint 19. As will be discussed since both of the materials of this invention manifest p-type conductivity as made, region 17 may constitute the unconverted material and, therefore, be of p-type conductivity while region 16 of n-type conductivity may be produced, for example, by doping with a significant impurity such as iodine from Group VII of the Periodic Table according to Mendelyeev.

As is well known to those skilled in the art, ohmic contact such as that made by electrode 11 may be made, for example, by use of a solder 12 containing a material having an excess of electrons where the region contacted is n-type and a deficiency of electrons where the region contacted is p-type. It is not considered necessary to a description of this invention to include specific contacting materials and other design criteria well known to those skilled in the art of the fabrication of semiconductive devices.

Fig. 2 depicts one type of apparatus found suitable for the preparation of each of the semiconductive compounds herein. Reference will be made to this figure in the examples relating to the actual preparation of these compounds. The apparatus of this figure consists of a resistance wire furnace 25 containing three individual windings 26, 27 and 28 as indicated schematically, these windings comprising turns of platinum-20 percent rhodium resistance wire. In operation, an electrical potential is applied across terminals 29 and 30 and also across terminals 31 and 32 by means not shown. The amount of current passing through resistance winding 27 is controlled by means of an autotransformer 33 while the amount of current supplied to windings 26 and 28 is controlled by autotransformer 34, so that the temperature of the furnace within winding 27 may be controlled independently of the temperature in the furnace within windings 26 and 28. Switch 35 makes possible the shunting of winding 28 while permitting current to pass through winding 26. The functions served by autotransformers 33 and 34 and switch 35 are explained in conjunction with the general description of the method of synthesis.

Within furnace 25 there is contained sealed container 36 which may be made of silica and may, for example, be of an inside diameter of the order of 19 millimeters within which there is sealed a second silica crucible 37 containing the component materials 38 used in the synthesis of a compound of this invention. Coating 39 on the inner surface of crucible 37 may be of a material such as carbon having the effect of reducing adhesion between surface 39 and the final compound. Inner crucible 37 is closed at its upper end with graphite cap 40 having hole 41 so as to prevent possible boiling over into container 36 and to minimize heating of charge 38 during sealing off of container 36. In the synthesis of the materials herein thermal losses are reduced and temperature control gained by use of insulation layers 43 and 44 which may, for example be Sil-o-cell refractory.

The following is a general outline of a method of preparation used in the synthesis of the compounds of this invention. Reference will be had to this general outline in Examples 1 and 2 each of which sets forth the specific starting materials and conditions of processing utilized in the preparation of such a compound.

These starting materials were placed in crucible 37 which was then stoppered with cap 40 and placed within container 36. Outer container 36 was then evacuated, filled with tank nitrogen at a pressure of two-thirds of an atmosphere and was sealed and placed within furnace 25. With switch 35 open, an electrical potential was then applied across terminals 29 and 30 and also terminals 31 and 32 and autotransformers 33 and 34 were adjusted so as to result in a temperature in the central portion of the furnace of from about 650° C. to about 750° C. and preferably about 680° C. and so as to result in furnace temperatures within windings 26 and 28 of from about 75° C. to about 100° C. higher than that of the central portion of the furnace. The upper and lower portions of the furnace were maintained at the higher temperature to prevent dynamic loss by vaporization and condensation of vaporizable constituents.

The furnace was maintained at the temperatures and gradients indicated in the paragraph preceding for a period of about two hours after which power to terminals 31 and 32 was terminated and switch 35 was closed so as to shunt winding 28 thus creating a temperature gradient with the high end of the gradient at the top of the furnace and the low end of the gradient at the botom of the furnace as the melt cooled. Under the conditions indicated the temperature gradient was from a high of about 700° C. to a low of about 450° C. This gradient was maintained for a period of about one hour after which the current was turned off and the melt permitted to return to room temperature.

Heating of the furnace was gradual taking about three hours from room temperature to the high temperature of about 700° C. so that the major portion of the alloying was carried out over a range of temperature at which the vapor pressure of sulfur is relatively low, thereby minimizing loss of this vaporizable material. Microscopic examination and thermal analysis showed that the compounds were single phase. Melting points and energy gaps are reported in the examples which follow:

*Example 1*

$Cu_3AsS_4$ was prepared in accordance with the above outline using a mixture of 17.88 grams of copper, 7.03 grams of arsenic and 12.02 grams of sulfur. These materials were thoroughly mixed with a spatula before being placed in crucible 37. The final ingot was single phase, had a melting point of 655° C., and energy gap of about 0.8 electron volt and was of p-type conductivity.

*Example 2*

$Cu_3SbS_4$ was prepared as above using a starting charge of 11.91 grams of copper, 7.61 grams of antimony and 8.02 grams of sulfur. The final material was single phase, had a melting point of 555° C., an energy gap of about 0.8 electron volts and was of p-type conductivity.

In the examples above, it was found that particle size of starting constituents was not critical. Actual particle sizes used varied from about 0.1" to about 0.5".

Both of the compounds of this invention manifest hole conductivity so that both are extrinsic semiconductors as made. That the conductivity mechanism of these compounds is an extrinsic characteristic at least in part due to incorporation of significant impurities is further evidenced by the variation in resistivity values observed among samples of the naturally occurring and synthesized materials, and also by changes in resistivity and in conductivity type brought about by doping.

The conductivity type of the compounds of this invention has been successfully converted by the use of small amounts of doping elements. In accordance with conventional doping theory it is to be expected that the conductivity type of either of the ternary compounds herein may be caused to approach n-type material by substitution of any one of the elemnts of the compound by any element having a larger number of electrons in its outer ring and to approach p-type by such substitution with an element having a smaller number of such electrons. The determination of practical significant impurities additionally depends upon physical and chemical characteristics which will permit such substitution without appreciably affecting the crystallography and the chemical composition of the compound. A substantial amount of study has been given these considerations in the field of doping of semiconductive materials in general and criteria upon which an accurate prediction may be premised are available in the literature, see for example, L. Pincherle and J. M. Radcliffe, Advances in Physics, volume 5, 19, July 1956, page 271. In general, it has been found that if the intrinsic element so chosen is chemically compatible with both the compound and the atmosphere to which the compound is exposed during hgih temperature processing, this element, if it has an atomic radius which is fairly close to that of one of the elements of the ternary compound, will seek out a vacancy in the lattice and will occupy a site corresponding with that of that element of the compound. Doping may be effected also by introduction of small atoms which appear to occupy interstitial positions as, for example, lithium in germanium and hydrogen in zinc oxide.

In accordance with the above, it has been found that iodine from Group VII of the Periodic Table having a radius of 1.33 A. will readily occupy a sulfur site in either of the compounds of this invention and thereby act as a significant impurity inducing n-type conductivity. Sulfur is an element in the sixth group of the Periodic Table and has a radius of 1.04 A. Other elements from the seventh group of the Periodic Table have a similar effect. It has been found that chlorine, for example, having a radius of 0.99 A. also substitutes for sulfur and induces n-type conductivity although it is not generally considered to be a desirable significant impurity since it is extremely reactive with moisture, and precautions must be taken to keep the atmosphere dry during its introduction. Starting with the compounds herein as made p-n junctions are produced by diffusing iodine or other donor material into the solid material. Manganese having an atom radius of 1.17 A. is also effective as a donor.

In common with experience gained from studies conducted on other semiconductor systems, it is found that addition of impurities in amounts of over about 1 percent by weight may result in degenerate behavior. Amounts of significant impurity which may be tolerated are generally somewhat lower and are of the order of 0.01 atomic percent. However, it is not to be inferred from this observation that semiconductor devices of this invention must necessarily contain 99 percent or more of a particular semiconductive compound disclosed herein. It is well established that desirable semiconductive properties may be gained by the combination of two or more semiconductive materials, for example, for the purpose of obtaining a particular energy gap value. For this reason, therefore, it is to be expected that either of the compounds herein may be alloyed with the other or with any other semiconductive material without departing from the scope of this invention.

The invention is directed to semiconductor systems utilizing one or more of the compounds of the formula $Cu_3XS_4$ where X is arsenic or antimony, and to devices utilizing such systems.

Although the invention has been described primarily in terms of specific doping elements and specific devices, it is to be expected that the wealth of information gained through studies conducted on other semiconductor systems may be used to advantage in conjunction with this invention. Refining and processing methods, as also diffusion and alloying procedures and other treatment known to those skilled in the art, may be used in the preparation of materials and devices utilizing the compounds herein, without departing from the scope of this invention. Other device uses for the compounds herein are also known.

What is claimed is:

1. A semiconductor system containing a compound of the composition $Cu_3XS_4$ in which X is an element selected from the group consisting of arsenic and antimony and a significant impurity in an amount of up to 0.01 atomic percent of the said compound.

2. The semiconductor system of claim 1 containing at least 99 percent by weight of the said compound.

3. The semiconductor system of claim 1 in which the significant impurity is an element of Group VII of the Periodic Table in accordance with Mendelyeev.

4. The semiconductor system of claim 3 in which the significant impurity is iodine.

5. The semiconductor system of claim 1 in which 99 percent by weight of the material therein contained other than the said compound and the said significant impurity exhibits semiconducting properties.

6. A semiconductor transducing device comprising a body consisting essentially of a compound of the composition $Cu_3XS_4$ in which X is an element selected from the group consisting of arsenic and antimony, said body containing at least one p-n junction.

7. The device of claim 6 in which the said compound is $Cu_3AsS_4$.

8. The device of claim 6 in which the said compound is $Cu_3SbS_4$.

References Cited in the file of this patent

FOREIGN PATENTS 1,120,304 France ---------------- Apr. 16, 1956

OTHER REFERENCES

Mellor: Comprehensive Treatise on Inorganic and Theoretical Chemistry, London 1923, Longmans, Green and Company, vol. 3, page 7.

Hackh's Chemistry Dictionary, 3rd edition, page 226.